US006548832B1

(12) United States Patent
Sakamoto et al.

(10) Patent No.: US 6,548,832 B1
(45) Date of Patent: Apr. 15, 2003

(54) HYBRID INTEGRATED CIRCUIT DEVICE

(75) Inventors: Noriaki Sakamoto, Gunma (JP); Hisashi Shimizu, Gunma (JP); Susumu Ota, Gunma (JP); Yoshiyuki Kobayashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/536,921

(22) Filed: Mar. 28, 2000

(30) Foreign Application Priority Data

| Jun. 9, 1999 | (JP) | 11-162506 |
| Jul. 29, 1999 | (JP) | 11-215258 |
| Jul. 29, 1999 | (JP) | 11-215260 |

(51) Int. Cl.[7] .............................................. H01L 33/00
(52) U.S. Cl. ............................ 257/88; 257/81; 257/93; 257/94; 257/95; 257/98; 257/99
(58) Field of Search ............................ 257/81, 82, 88, 257/89, 93, 95, 98, 99

(56) References Cited

U.S. PATENT DOCUMENTS

| 5,278,432 A | * | 1/1994 | Ignatius et al. | 257/88 |
| 5,298,768 A | * | 3/1994 | Okazai et al. | 257/81 |
| 5,321,305 A | * | 6/1994 | Sakamoto | 257/666 |
| 5,338,704 A | * | 8/1994 | Imai et al. | 257/99 |
| 5,660,461 A | * | 8/1997 | Ignatius et al. | 362/241 |
| 5,698,866 A | * | 12/1997 | Doiron et al. | 257/99 |

FOREIGN PATENT DOCUMENTS

JP      9-252651      9/1997

* cited by examiner

*Primary Examiner*—Nathan J. Flynn
*Assistant Examiner*—Leonardo Andujar
(74) *Attorney, Agent, or Firm*—Fish & Richardson P.C.

(57) ABSTRACT

In a light irradiation device in which a light emitting element is attached to a printed circuit board, the heat radiation properties are enhanced, and improvement of the light emitting efficiency and reduction of the size and weight are realized. A Cu pattern covered with Ni is formed on a metal substrate 11. Light emitting elements 11 are mounted on the pattern in the form of a series circuit. Metal substrates in each of which the series connection is formed are connected to one another in parallel. Since Ni has excellent corrosion resistance and a high reflection efficiency, the surfaces of the substrates themselves can be used as reflective plates. A lens 37 is formed for each of the light emitting elements, whereby the emission efficiency can be further improved.

When a circuit is configured in one region of a hybrid integrated circuit substrate, a position recognition mark 53 and a flow stop 57 are disposed in the open region. Also the region is covered with Ni so as to function as reflecting means.

18 Claims, 7 Drawing Sheets

HYBRID INTEGRATED CIRCUIT DEVICE

BACKGROUND OF THE INVENTION

1. Field of the Invention

The present invention relates to a hybrid integrated circuit device, and more particularly to a light irradiation device in which a plurality of light emitting elements are mounted.

2. Description of the Related Art

Figure 6:
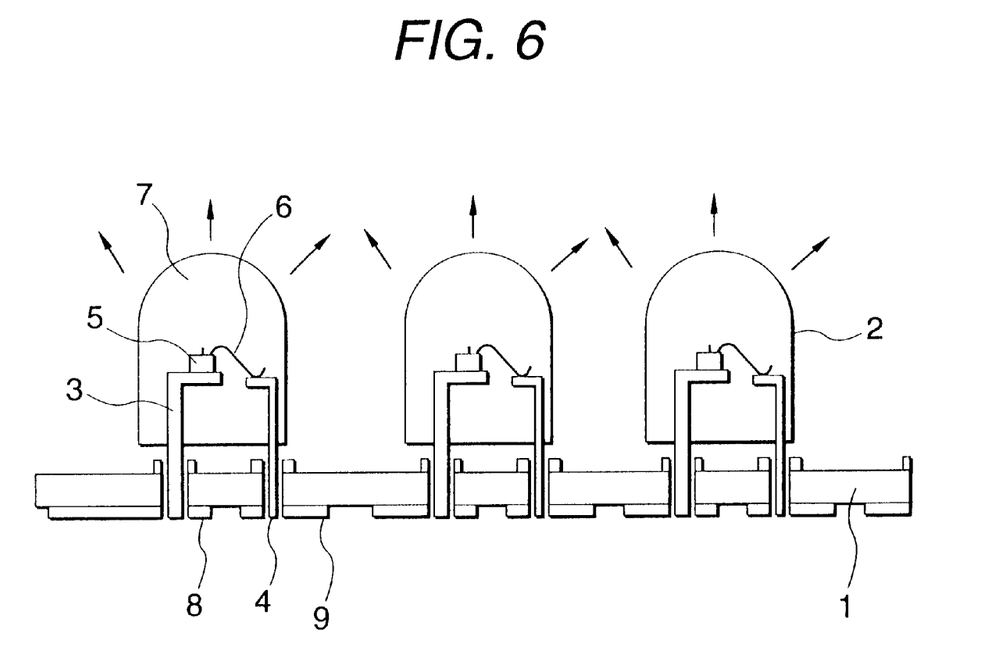
FIG. 6 is a view illustrating an irradiation device of the conventional art.

When an article is to be irradiated with a large amount of light, a device such as an electric lamp is usually used. In some cases, in order to reduce the size and weight of the device and the power consumption, a device in which light emitting elements 2 are mounted on a printed circuit board 1 as shown in FIG. 6 is used.

As the light emitting elements, light emitting diodes which are configured by semiconductor materials are mainly used. Alternatively, semiconductor lasers or the like may be used.

In each of the light emitting diodes 2, two leads 3 and 4 are used. The rear face (anode or cathode) of a light emitting diode chip 5 is fixed to the one lead 3 by soldering or the like. The other lead 4 is electrically connected via a thin metal wire 6 to an electrode (cathode or anode) on the surface of the chip. A transparent resin sealing member 7 which will serve as a lens is formed to seal the leads 3 and 4, the chip 5, and the thin metal wire 6.

On the other hand, electrodes 8 and 9 for supplying a power to the light emitting diode 2 are disposed on the printed circuit board 1. The leads are inserted into through holes opened in the electrodes. The light emitting diode 2 is mounted on the board via solder or the like.

A light irradiation device using such light emitting diodes is described in, for example, JP-A-9-252651.

As described above, the light emitting element 2 is configured by a package into which the resin sealing member 7, the leads 3 and 4, and the like are incorporated. When a large number of light emitting elements are mounted, therefore, there arise problems such as that the circuit board 1 is large in size and weight. Since the heat radiation properties of the circuit board itself are inferior, the circuit board has a problem in that the temperature of the whole device is excessively raised. Consequently, the temperatures of semiconductor chips themselves which constitute the light emitting elements are raised, thereby producing a problem in that the driving ability is lowered.

In the light emitting diode 2, light is emitted also from side and rear faces, and hence light directed toward the circuit board 1 exists. Since the circuit board 1 is configured by a printed circuit board, there is another problem in that irradiation of a high efficiency cannot be realized.

SUMMARY OF THE INVENTION

The invention has been conducted in view of the above-discussed problems. In the invention, the surface of a conductive pattern constituting a protection circuit for a light emitting diode is made of a metal material which is excellent in light reflection, whereby the efficiency of reflection with respect to light emitted from the light emitting diode can be improved.

Furthermore, an island-like conductive pattern is disposed in an open region surrounded by a conductive pattern and/or a semiconductor element, the conductive pattern and/or the semiconductor element constituting the protection circuit, and the surface of the conductive pattern is made of a metal material which is excellent in light reflection, whereby the efficiency of reflection with respect to light emitted from the light emitting diode can be improved.

When the semiconductor element constituting the protection circuit is to be die-bonded or wire-bonded, a bonder knows the position of a mark and then performs an alignment operation. Also the surface of the mark is made of a metal material which is excellent in light reflection, whereby improvement of the reflection efficiency can be realized.

In order to prevent the semiconductor element from being deteriorated, a resin is applied to the semiconductor element. The applied resin is cured. An uncured resin is fluid and hence may flow even to an unexpected place. In such a case, there arise problems as follows. When a resin flows to a chip resistor and is then cured, the resistance is varied. When a resin flows onto wiring and is then cured, the wiring is peeled off. A pattern for preventing such a flow from occurring is disposed in an open region. Therefore, the efficiency of reflection with respect to light emitted from the light emitting diode can be improved by configuring the surface of the pattern with a metal material which is excellent in light reflection.

Each aspect of the device described below is separately illustrative of the various embodiments of the invention and is not intended to be restrictive of the broad invention.

A first aspect of the device is a hybrid integrated circuit device which comprises: a wiring portion consisting of a first wiring of reflective conductive film so as to cover an whole surface of a substrate; and a second wiring facing to the first wiring through a slit; a light emitting element mounting region formed on a part of the wiring portion so that a light emitting element is mounted; and a light emitting element mounted on the light emitting element mounting region.

A second aspect of the device is a hybrid integrated circuit device according to the first aspect, wherein the slit has a constant width for a whole area.

A third aspect of the device is a hybrid integrated circuit device according to the first aspect, wherein the reflective conductive film is formed so as to guide a light emitted by the light emitting element mounted on the light emitting element mounting region into a front direction effectively.

A fourth aspect of the device is a hybrid integrated circuit device according to the first aspect, wherein the wiring portion is covered with a reflective conductive film in a whole region except for a slit for isolating the first wiring and the second wiring each other.

A fifth aspect of the device is a hybrid integrated circuit device according to the first aspect, wherein the slit has a smallest width which is able to be isolated.

A sixth aspect of the device is a hybrid integrated circuit device according to the first aspect, wherein said hybrid integrated circuit device comprises: a first wiring disposed on a hybrid integrated circuit substrate; a second wiring which is disposed in opposed relation with said first wiring; and a plurality of light emitting diodes which are connected in series between said first and second wirings, a protection circuit for said light emitting diodes is mounted in a region of said hybrid integrated circuit substrate, and a surface of a conductive pattern constituting said protection circuit is configured by a light reflective film.

A seventh aspect of the device is a hybrid integrated circuit device according to the first aspect, wherein said hybrid integrated circuit device comprises: a first wiring disposed on a hybrid integrated circuit substrate; a second wiring which is disposed in opposed relation with said first wiring; and a plurality of light emitting diodes which are connected in series between said first and second wirings,     a protection circuit for said light emitting diodes is mounted in an region of said hybrid integrated circuit substrate, an island-like conductive pattern is disposed in an open region surrounded by a conductive pattern and/or a semiconductor element, said conductive pattern and/or said semiconductor element constituting said protection circuit, and a surface of said island-like conductive pattern is configured by a light reflective film.

An eighth aspect of the device is a hybrid integrated circuit device according to the sixth aspect, wherein said island-like conductive pattern is an alignment mark.

An eighth aspect of the device is a hybrid integrated circuit device according to the sixth aspect, wherein said island-like conductive pattern is used for stopping a flow of a resin.

A tenth aspect of the device is a hybrid integrated circuit device according to the first aspect, wherein said hybrid integrated circuit device comprises: a first wiring which is disposed on a metal substrate with being insulated from said metal substrate; a second wiring which is disposed in opposed relation with said first wiring; a plurality of electrodes which are disposed between said first and second wirings; and a plurality of light emitting diodes which are connected between said first wiring and said electrodes, between said electrodes, and between said electrodes and said second wiring to be connected in series between said first and second wirings,     a protection circuit for said light emitting diodes is mounted in an region of said metal substrate, an island-like conductive pattern is disposed in an open region surrounded by a conductive pattern and/or a semiconductor element, said conductive pattern and/or said semiconductor element constituting said protection circuit, and     surfaces of said first electrode, said electrodes, said second wiring, and said island-like conductive pattern are configured by a light reflective film.

An eleventh aspect of the device is a hybrid integrated circuit device according to the tenth aspect, wherein said film is a film which is formed on a conductive pattern made of copper, and which is made of anyone of Au, Ni, and solder.

A twelfth aspect of the device is a hybrid integrated circuit device according to the tenth aspect, wherein a resin which seals said semiconductor element constituting said protection circuit is disposed on said semiconductor element, and said resin is contacted with said island-like conductive pattern.

A thirteenth aspect of the device is a hybrid integrated circuit device according to the tenth aspect, wherein the substrate is made of a surface insulated metal substrate.

A fourteenth aspect of the device is a hybrid integrated circuit device according to the first aspect, wherein the first and second wiring are disposed on the substrate so as to be symmetric each other with respect to the centerline of the substrate.

A fifteenth aspect of the device is a hybrid integrated circuit device according to the first aspect, wherein the light emitting element is a plurality of light emitting diodes which are mounted on the first wiring and the second wiring so as to be odd raw in a direction perpendicular to the first and second wirings.

A sixteenth aspect of the device is a hybrid integrated circuit device according to the first aspect, wherein the first wiring and the second wiring are extended to the both side ends of the substrate.

A seventeenth aspect of the device is a hybrid integrated circuit device according to the first aspect, wherein the substrate is made of a plurality of metal substrates whose surfaces are covered with an insulating film, and each of the substrates has a first wiring formed along a first side of the metal substrate; a second wiring formed along a second side opposite to the first side; and each of light emitting diodes connected on the first and second wirings which are connected over a distance between first and second substrate so that the light emitting diodes connected in serial by means of metallic wiring.

An eighteenth aspect of the device is a hybrid integrated circuit device according to the first aspect, wherein the first substrate and the second substrate which are juxtaposed each other, have opposite wiring pattern each other so that the first wirings of the first and second substrates can be connected at a nearest neighbor point.

An nineteenth aspect of the device is a hybrid integrated circuit device according to the eighteenth aspect, wherein the first and second wiring are formed on the substrate so as to be symmetric each other with respect to a center line of the substrate, and bonding area or solder bonding area is formed on each of both ends of the substrate.

A twentieth aspect of the device is a hybrid integrated circuit device according to the nineteenth aspect, wherein the bonding area or solder bonding area has a plurality of areas formed on each of both ends of the substrate.

A twenty first of the apparatus is a light emitting apparatus using a hybrid integrated circuit device according to the fifth aspect, wherein the device is formed so as to use a water having been cooled the substrate as a water for feeding a plant substrate, and a light generated by the device is irradiated to the plant to be grown owing to a light synthetics by the diodes mounted on the substrate.

As seen from the above description, when a substrate mainly made of Al is employed, particularly, it is possible to realize a hybrid integrated circuit device which can attain excellent heat radiation properties, light weight, and high workability, and which has a high reflection efficiency.

DESCRIPTION OF THE PREFERRED EMBODIMENTS

Embodiments of the invention will be described with reference to FIGS. 3, 4, and 5. Hereinafter, connection of a light emitting diode 10 will be particularly described.

A hybrid integrated circuit substrate 11 configured by a metal member which is punched out by a pressing (cutting) work. As the material of the hybrid integrated circuit substrate 11, a metal such as Al, Cu, or Fe may be used.

In the embodiment, a.metal substrate is used as the hybrid integrated circuit substrate by reasons including: that heat generated from a light emitting element can be efficiently radiated to the outside; that the temperature of the light emitting element can be prevented from being, raised, thereby improving the driving ability; that the flatness of the substrate causes light emitted in a direction other than the upward one to be efficiently reflected by the substrate 11 to be upward directed; and that workability for forming screw holes for mounting, workability for forming a curved face such as a paraboloid, and other workabilities are excellent. Alternatively, a ceramic substrate or a printed circuit board may be used. However, a ceramic substrate has a low impact resistance, and a printed circuit board has low heat radiation properties. Of course, these materials may be employed as required.

In the invention, Al is employed in view of workability and light weight. In this case, in order to improve the insulation properties, an oxide may be formed on the surface by anodic oxidation, and an insulative resin 12 may be formed on the oxide. The anodic oxide film may be omitted, or a film other than the film may be produced by a chemical reaction. Since the surface of Al is flat, it is preferable to produce a rough face 13 mechanically or chemically in order to improve the adhesiveness between the substrate and the insulative resin.

The rear face of the Al substrate 11 is mechanically weak to be easily damaged, and has no resistance to corrosion. Therefore, the rear face may be covered with a film of an insulative resin 14 as required.

The whole face of the hybrid integrated circuit substrate 11 is covered with the insulative resin 12 in view of a short circuit with first and second electrodes 15 and 16 which are formed on the substrate. The first and second electrodes 15 and 16 are used for connecting light emitting diodes in series.

In a process of transmitting heat generated from a light emitting diode to the metal substrate 11, the insulative resin film 12 functions as a thermal resistance material. In order to reduce the thermal resistance as far as possible, an insulative resin which is mixed with a filler such as an Si oxide film or aluminum oxide is employed. It is a matter of course that the thermal resistance is lower in the case of aluminum oxide.

Figure 1:
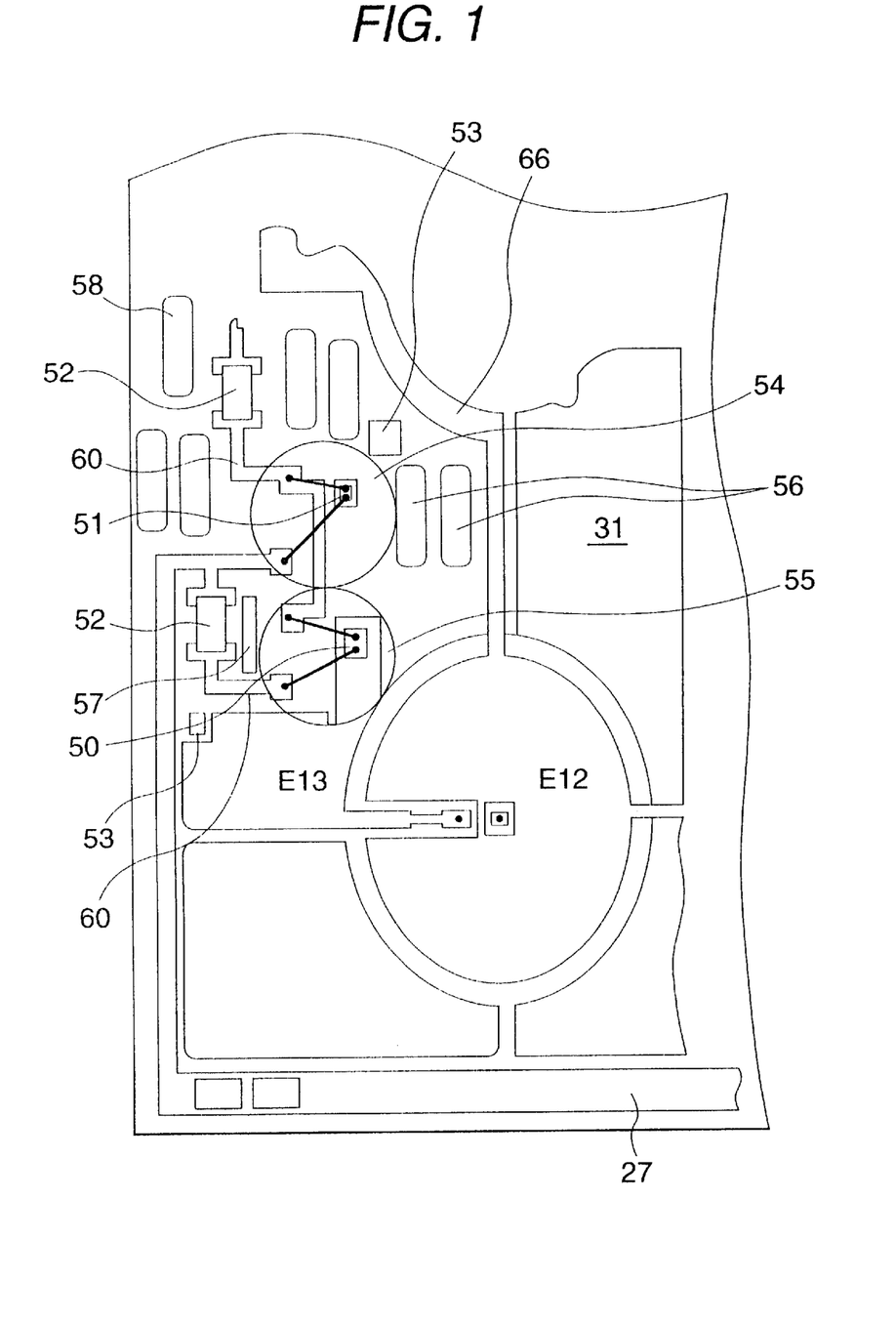
FIG. 1 is a partial view of a hybrid integrated circuit device which is an embodiment of the invention.

A conductive pattern includes the electrodes 15 and 16, and is made of, for example, Cu foil, and functions as a wiring, a land for a chip, a pad for bonding, and, as required, a fixing pad for an external lead. A bare light emitting diode 10 is disposed on the first electrode 15. The rear face of a light emitting diode chip is configured as one of two types, or the cathode type and the anode type. In FIG. 1, the rear face is configured as the anode type. When the direction of the power supply is reversed, the cathode type may be used. The electrode on the surface of the light emitting diode is connected to the second electrode 16 via a thin metal wire 17. Therefore, a plurality of the light emitting diodes 10 are connected in series via the electrodes between the first and second wirings 26 and 27.

In order to cause the device to function as a light irradiation device, the light emitting diodes 10 are disposed in a scattered manner as described above. In FIG. 3, a driving circuit and/or a protection circuit for the light emitting diodes are externally disposed. Alternatively, as indicated by C in FIG. 4, such a driving circuit and/or a protection circuit may be mounted on the metal substrate 11. In the alternative, wirings, lands, bonding pads, pads for external electrical connection, and the like are patterned in the periphery of the substrate, particularly in the corners and their vicinities, and components such as chip capacitors, chip resistors, and printed resistors, transistors, diodes, and ICs are connected between the wirings, thereby realizing the circuits. Packaged elements may be mounted. However, bare chip elements are superior from the viewpoints of heat radiation properties and mounting area. These elements will be generally referred to as circuit elements.

These circuit elements are electrically fixed via, for example, a brazing material such as solder, or silver paste, and the printed resistors are formed by screen printing. In order to electrically connect the semiconductor chips to the wirings, the thin metal wires 17 are electrically connected between the electrodes on the chips and the bonding pads, and, as required, external leads are electrically connected to the pads via solder. In view of mounting, at least two screwing holes may be opened in the sides of the substrate.

Figure 2:
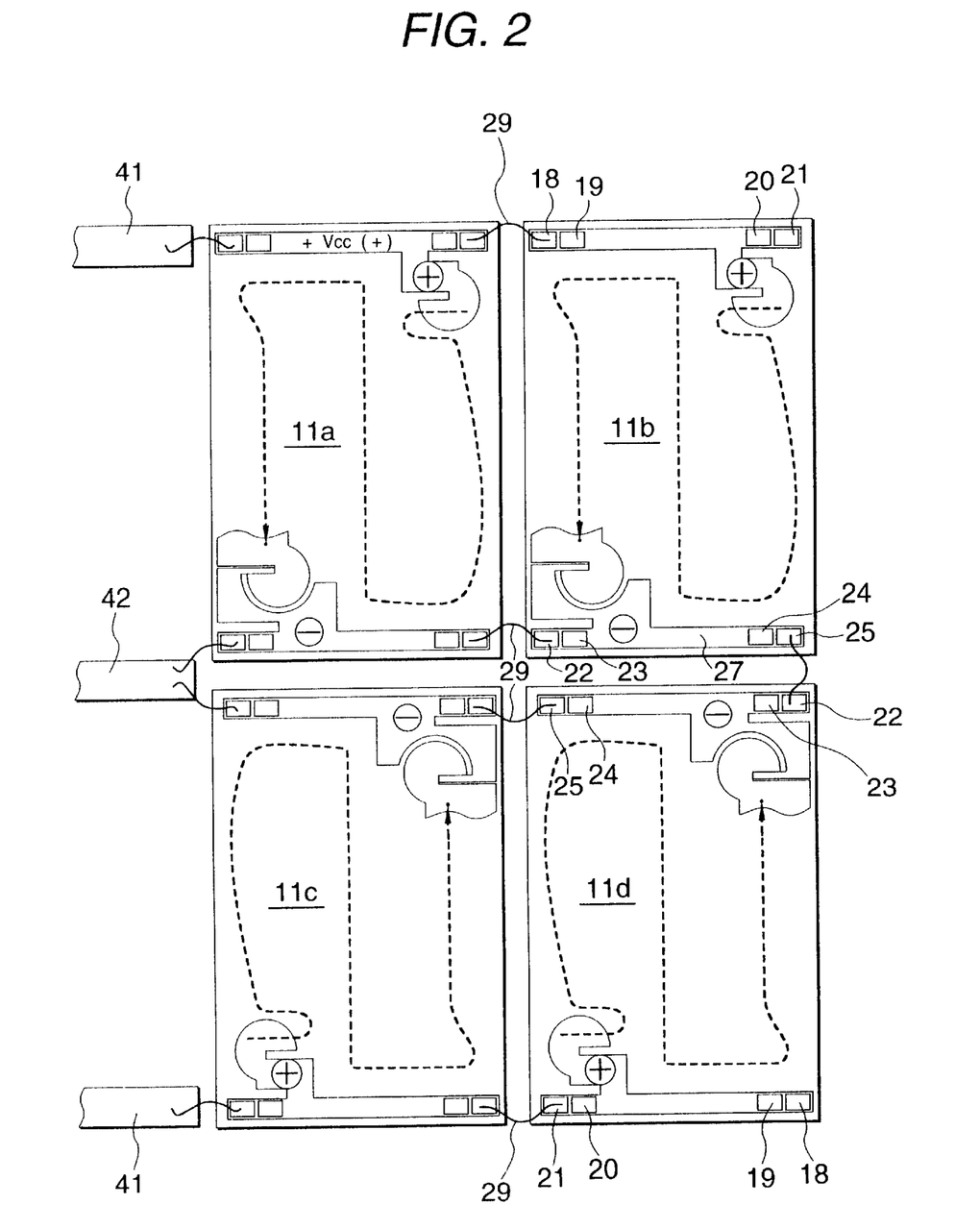
FIG. 2 is a view of the hybrid integrated circuit device which is the embodiment of the invention.

As shown in FIG. 2, the hybrid integrated circuit substrates 11 are arranged in a matrix form as described later. Therefore, connection areas 18 to 21 are disposed in both the ends of the first wiring 26, and connection areas 22 to 25 are disposed in both the ends of the second wiring 27. In the case where connecting means 20 and 30 are thin metal wires, these areas are configured as bonding areas, and, in the case where the means are leads which can be fixed by a brazing material, the areas are configured as formation areas for the brazing material.

Alternatively, the Cu pattern on the metal substrate 11 may be realized by bonding a pattern to an insulative flexible sheet, and then bonding the flexible sheet to a hybrid integrated circuit substrate.

The specific structure will be further described with reference to FIG. 3.

As described above, the whole face of the metal substrate 11 is covered with the film of the insulative resin 12. In the figure, in addition to the first and second electrodes 15 and 16, island-like reflection electrodes 31 to 36 are disposed. Of course, a countermeasure against a short circuit is taken. Specifically, the electrodes are separated from one another by a predetermined distance. In this case, the driving circuit and/or the protection circuit are not mounted. The two kinds of connection electrodes 15 and 16 may occupy a substantially whole area of the metal substrate 11 except the circuits and the first and second wirings 26 and 27.

For example, a first electrode 15a or a first electrode 16a may be integrated with the reflection electrode 31. By contrast, the formation of the reflection electrode 31 between the electrodes improves the dielectric properties.

In the first and second electrodes 15 and 16, the surface of Cu is covered with Ni. This is conducted in order to prevent Cu from being oxidized. The light reflection efficiency is lowered by oxidation. Therefore, Ni or Au which is relatively hardly oxidized, excellent in light reflection property, and glossy is employed in view of also the properties of bonding with respect to a thin metal wire. In the embodiment, Ni is employed from the viewpoint of cost. A substantially whole area of the metal substrate 11 is covered with Ni having substantial glossiness so as to be used as a reflective plate. In the embodiment, Ni is formed on the conductive pattern made of copper, by plating or the like. Alternatively, the conductive pattern itself may be configured by the above-mentioned material. Recently, a brazing material which does not contain lead has been developed. When such a brazing material is used, a metal which has relatively low wettability with respect to the brazing material and which is glossy is selected. In each boding point, a bondable material (Al, Ni, Cu, or Au) may be formed, and other portions may be covered with a material which easily reflects light, such as silver or platinum. In the embodiment, an aluminum wiring is bonded, and hence Ni is employed as the metal covering the surface.

In the case where Ni is employed, the contact resistance with respect to the first electrode 15 is considered. Therefore, only Ni corresponding to the region of fixing the land is removed away, and the light emitting diode 10 in the form of a bare chip is electrically fixed to the exposed Cu via a conductive fixing material such as silver paste or solder. In this configuration, the reflection efficiency can be further improved. Alternatively, in view of the fixing properties, the whole region of the land may not be covered with Ni.

The light emitting diode 10 is connected to the second electrode 16 via the electrode on the chip surface and the thin metal wire 17. In the case where Al is employed as a thin metal wire, the Al wire can be usually connected to the surface of Ni by a bonding operation based on an ultrasonic wave.

Figure 5:
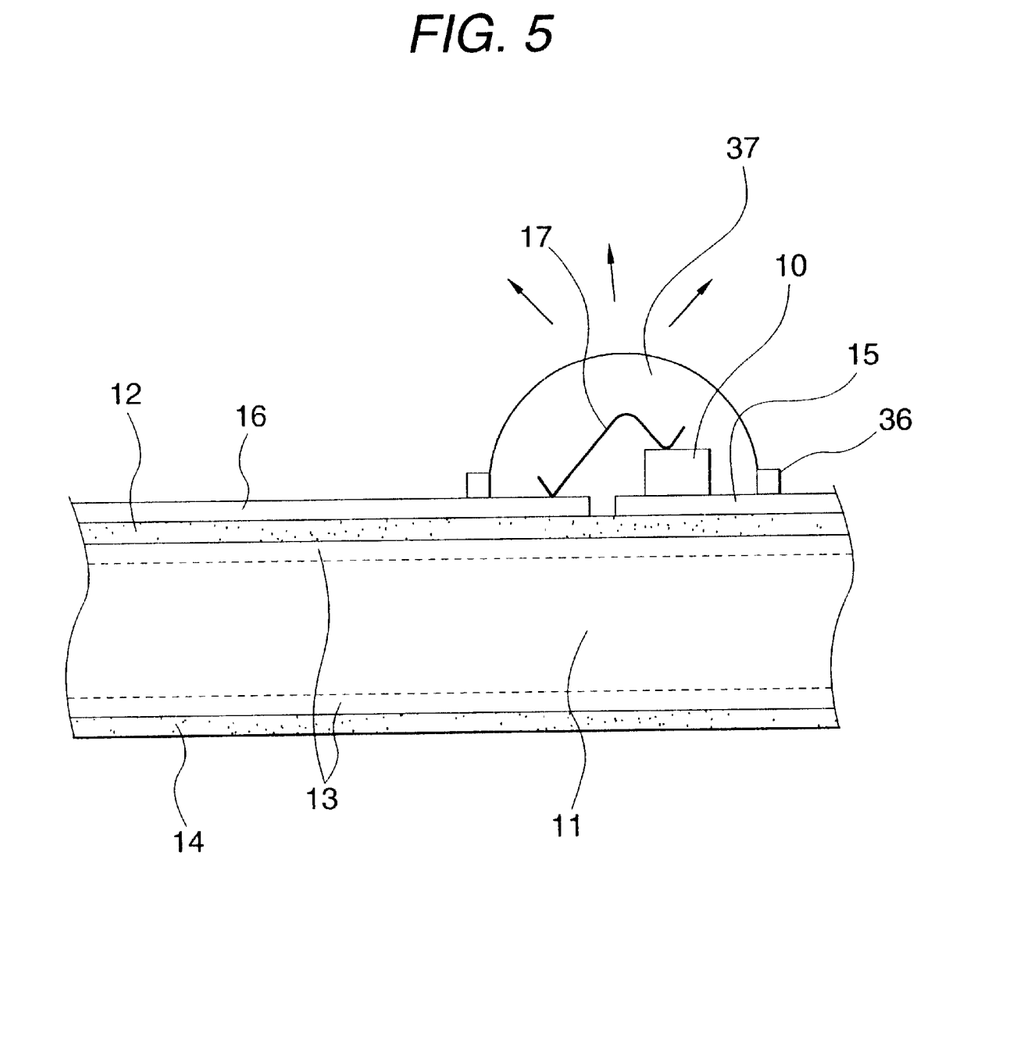
FIG. 5 is a section view illustrating a hybrid integrated circuit substrate.

As shown in FIG. 5, a light transmitting resin is disposed so as to seal at least the light emitting diode 10. The resin is employed as a lens 37, and formed into a protruding shape so that upward emission from the substrate is efficiently performed. As the material of the lens 37, any resin may be used as far as it is transparent to the emitted light. In the embodiment, a silicone resin, an epoxy resin, or the like is employed. Both the resins are of the heat curing type, and exhibit a low viscosity during a heat curing process. Therefore, the resins cannot be stably formed into a hemisphere shape which is preferably used as a lens. A silicone resin is originally in a liquid state, and its viscosity is not largely changed even during a heat curing process. The viscosity of an epoxy resin is lowered during a heat curing process. In the invention, consequently, flow-stopping means 36 is formed so as to surround the light emitting diode 10 as shown in FIG. 5.

The color of an epoxy resin is gradually changed to yellow by heat. By contrast, the degree of color change in a silicone resin is low. An epoxy resin has excellent wettability. Conversely, a silicone resin has high repellent properties. A cured silicone resin is in a rubber-like or gel state, so that stress exerted on the thin metal wire serving as connecting means for a circuit element is smaller as compared with the case of an epoxy resin.

When a silicone resin is used as the flow-stopping means, a resin (a silicone resin or an epoxy resin) stored inside the means is easily repelled to be formed into a lens-like shape by means of the surface tension. By contrast, when an epoxy resin is used as the flow-stopping means, the resin is hardly formed into a lens-like shape because of high repellent properties. The lens is provisionally cured at about 100 to 150 deg. C., and then again heated at 150 deg. C. for one hour to be completely cured.

Depending on the size of the lens, the portion from the middle of the thin metal wire 17 to the portion where the wire is connected to the second electrode 16 is not covered with the resin sealing member, or the whole of the wire is completely covered with the resin as shown in FIG. 5. When the wire is completely covered with the resin, also improvement of the reliability of the connecting portion of the thin metal wire can be attained together with that of the light collecting ability.

The lens may be formed into a two-stage shape. This configuration is conducted in order to enhance the directivity of the lens. For attaining the two-stage shape, a silicone resin of low wettability is employed because the lens shape cannot be realized unless the wettability is particularly inferior.

Sometimes, a resin film or a so-called solder resist may be formed over the whole face. In this case, when a film which is as glossy as possible is selected, the film can be used as a reflective film in the same manner as Ni. It is a matter of course.that the film in the region of fixing the light emitting diode and the connecting portion of the thin metal wire is removed away. When the film is transparent, Ni functions as the main reflective member. When the film is colored, the color of the film is preferably set to white from the viewpoint of reflection efficiency.

Figure 3:
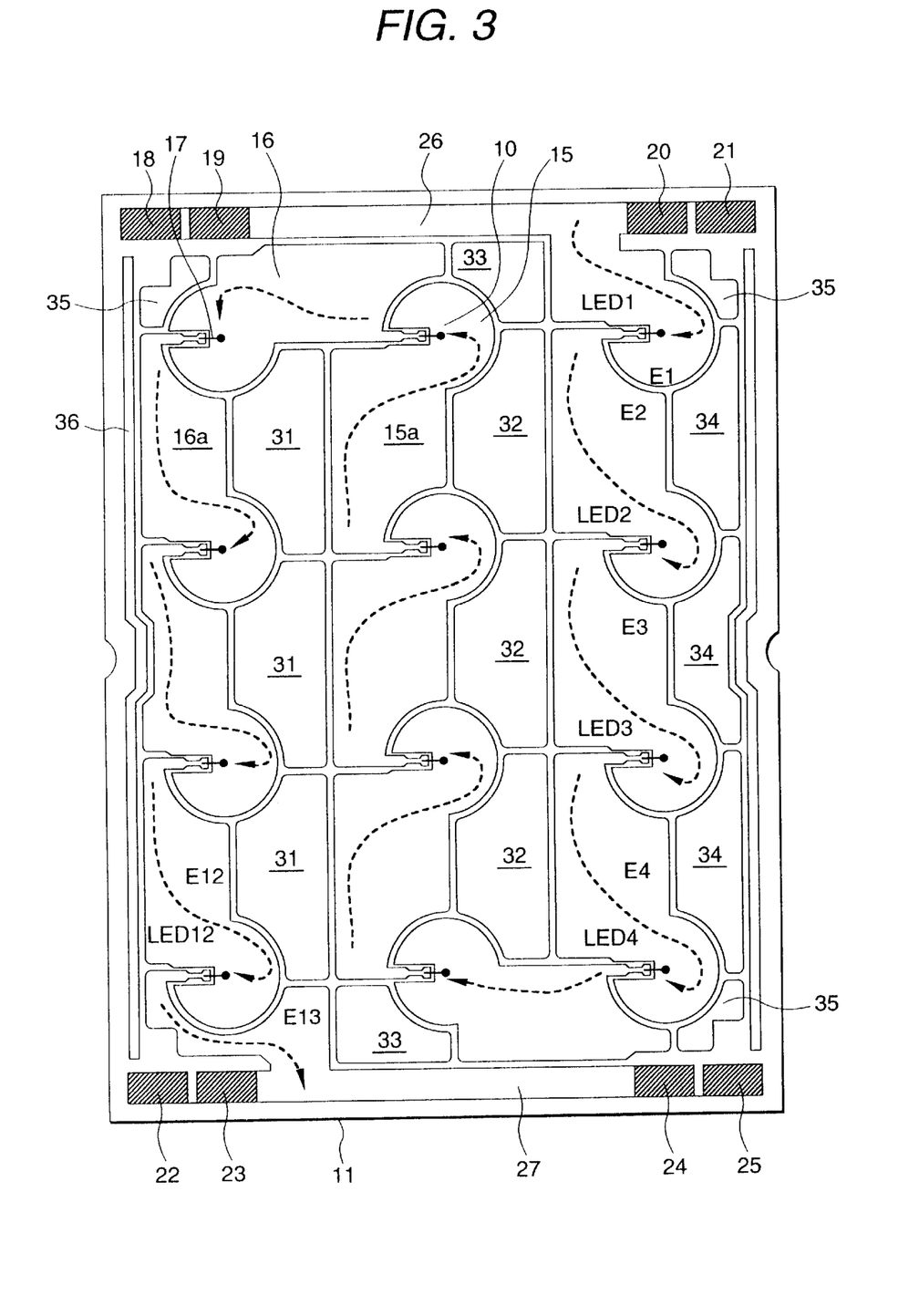
FIG. 3 is a view illustrating a hybrid integrated circuit substrate.
Figure 4:
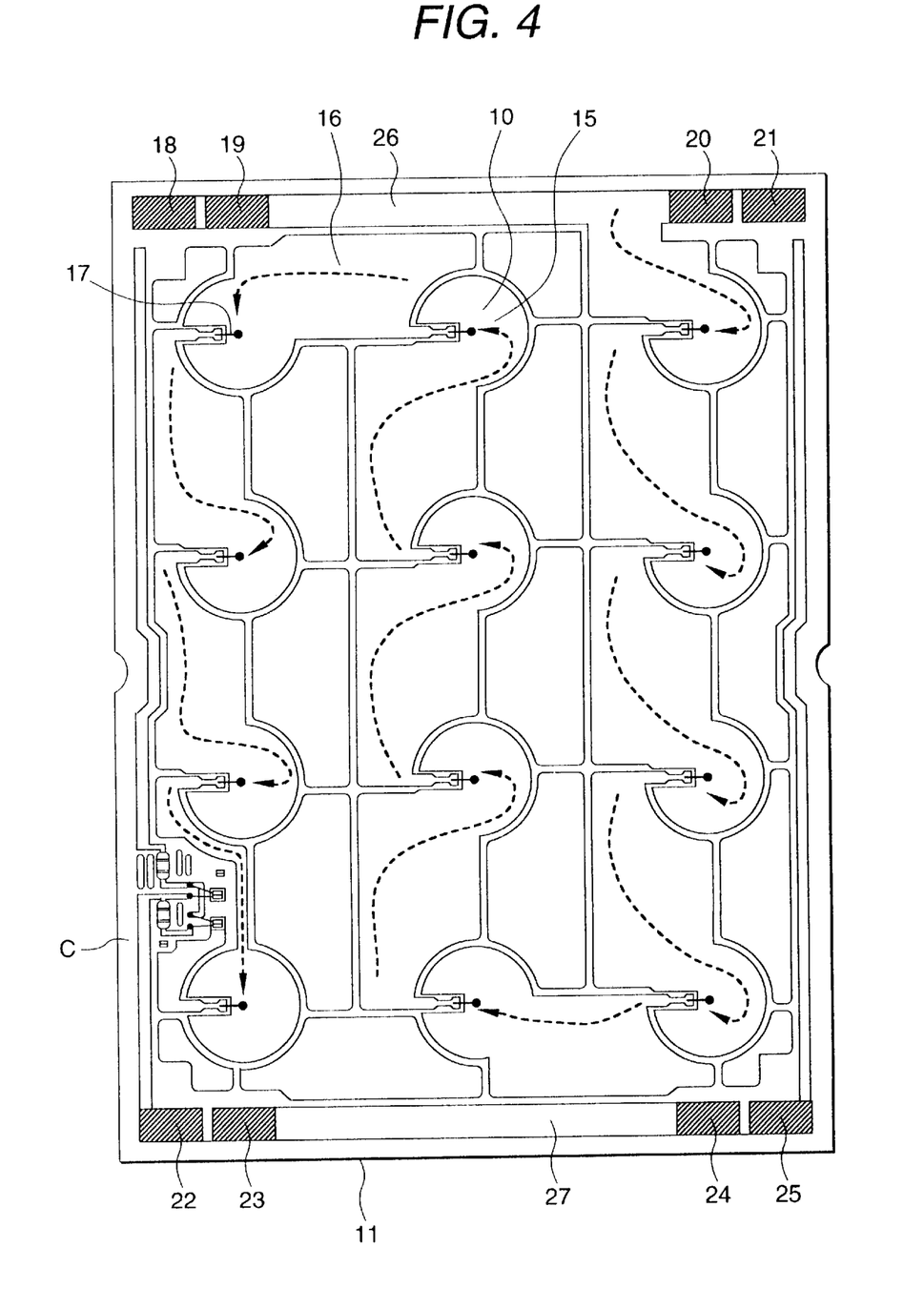
FIG. 4 is a view illustrating a hybrid integrated circuit substrate.

As indicated by the broken line arrows in FIGS. 3 and 4, the light emitting diodes 10 are connected in series between the first and second electrodes 15 and 16.

When the light emitting diodes are connected in parallel, for example, the contact resistances of the thin metal wires 17 and the chips are scattered. Consequently, a current is concentrated on a light emitting diode having a low contact resistance, among the many light emitting diodes 10, thereby causing a problem in that the specific light emitting diode is abnormally bright or finally broken.

To comply with the above, the light emitting diodes 10 are connected in series between the first and second wirings 26 and 27 as shown in FIGS. 3 and 4, so that the currents flowing through the light emitting diodes 10 are constant in level.

In the same manner as the above description, the configurations such as that electrodes are arranged over a substantially whole area of the metal substrate to serve as a reflective plate, that lenses are employed, and that Ni in die bonding regions is removed away are employed also in this example.

Referring to FIG. 3, the eleven connection electrodes E2 to E12 are formed between the first and second wirings 26 and 27. Electrodes E1 and E13 are formed integrally with the first and second wirings 26 and 27, respectively, and hence configured as the first and second wirings so as to be distinguished from the connection electrodes.

First, the chip rear face serving as the anode (or the cathode) of the light emitting diode LED1 is fixed to the first electrode E1, and the electrode on the side of the cathode (or the anode) is connected to the second electrode E2 by a thin metal wire 17. The chip rear face of the second light emitting diode LED2 is fixed to the second electrode E2, and the electrode on the chip surface is connected to the third electrode E3 by a thin metal wire. Furthermore, the chip rear face of the third light emitting diode LED3 is fixed to the third electrode E3, and the electrode on the chip surface is connected to the fourth electrode E4 by a thin metal wire. In this way, the light emitting diodes are sequentially connected in series so that the chip rear face of an N-th light emitting diode LED(N) is fixed to an N-th electrode E(N), and finally the electrode on the chip surface is connected to an (N+1)-th electrode E(N+1) by a thin metal wire.

The series connection is realized by repeating the connecting mode. Also in this case, in order to cause the electrodes made of copper foil to serve as reflective plates, the surfaces of the electrodes E1 to E(N+1) are covered with Ni, and, in order to cause the whole area of the substrate to substantially serve as a reflective plate, the patterning is performed so that the substrate is completely covered with the (N+1) electrodes, or, in the case where the substrate is not completely covered with the electrodes, the island-like reflection electrodes 31 to 36 are disposed in open regions. Of course, a small gap is formed so that the electrodes are separated from one another in the pattern.

In the structure, the currents flowing through the series-connected light emitting diodes are theoretically equal to one another in level, and hence all the light emitting diodes emit light in the same manner.

When one of the light emitting diodes is broken and no current flows, all the light emitting diodes stop the light emission.

As shown in FIG. 2, therefore, substrates are connected in parallel between a Vcc line 41 and a GND line 42.

In the case where a light irradiation device is originally to be realized by, for example, 120 (M) light emitting diodes, the light emitting diodes are divided into, for example, 10 (S) sections, 10 (S) metal substrates in each of which 12 (M/S) light emitting diodes are connected in series are prepared, and the substrates are connected in parallel. When a metal substrate of FIG. 4 is employed, a constant current circuit C serving as a protection circuit is disposed, so that the current capacities of all the light emitting diodes can be unified. Also in the case of FIG. 3, a constant current circuit may be employed. In this case, however, the circuit must be externally disposed on the input or output side of the light emitting diodes.

As described above, in each of the plural metal substrates in which the light emitting diodes are connected in series, the current level is determined by the constant current circuit, and hence the brightnesses of all the light emitting diodes are unified. Furthermore, also the brightnesses of the metal substrates are unified. Even when one of the light emitting diodes in any one of the hybrid integrated circuit substrates is broken, the function as an irradiation device can be maintained because the remaining substrates are connected in parallel. It is required to replace only the broken metal substrate with a new one, and hence the repair is requested only to be performed at the minimum degree.

By contrast, the wirings 26 and 27 are respectively disposed in the upper and lower sides of the hybrid integrated circuit substrate 11, so as to function as power supply lines. Both the wirings elongate from the left end to the right end. Specifically, in order to laterally connect a plurality of hybrid integrated circuit substrates 11 in parallel, the first and second wirings 26 and 27 elongate from the right sides of the corresponding hybrid integrated circuit substrate to the left side as shown in FIG. 2. As a result, the right end 21 of the first wiring 26 (or the second wiring 27) of a hybrid integrated circuit substrate 11a, and the left end 18 of the first wiring 26 (or the second wiring 27) of a hybrid integrated circuit substrate 11b can be connected to each other via the shortest distance. In this example, thin metal wires are used as connecting means 29. Alternatively, the connecting means may be realized by leads which can be fixed by a brazing material such as solder.

If the plural hybrid integrated circuit substrates 11 are realized by a single substrate, a fault due to a breakage of one of the light emitting diodes cannot be repaired, and there arise further problems in that fixation of the connecting means cannot be performed by an automatic machine, and that the fixation requires a production facility of a large scale. The latter problem is raised because of the following reasons. Naturally, the hybrid integrated circuit substrate is large. Therefore, a chip mounter which mounts a chip, and a bonder which performs a die bonding process on a thin metal wire must be realized as machines which have a wide working area. As a hybrid integrated circuit substrate is larger, the thermal capacity of the substrate is greater, and hence the temperature of the substrate itself is more hardly raised. As a result, there arises a problem in that the solderability and the bondability are lowered.

By contrast, in the invention, a parallel connection structure is employed, and the device is configured by plural hybrid integrated circuit substrates. Therefore, the workability of the device is identical with that of the conventional art. Since the hybrid integrated circuit substrates have a small size, the temperature of each substrate can be independently raised, so that the solderability and the bondability are improved.

The first or second wiring 26 or 27 is formed in a bilaterally symmetrical manner with respect to the center line 50.

In the case of the above configuration, advantages are obtained when the substrates are arranged in a matrix form as shown in FIG. 2.

For the sake of simplicity of the figure, a matrix of two rows and two columns will be described. In each of the hybrid integrated circuit substrates 11a and 11b of the first row, the first wiring 26 is placed along the upper side of the substrate, and, in each of the hybrid integrated circuit substrates 11c and 11d of the second row, the first wiring 26 is placed along the lower side. Namely, in order to reduce the total number of the Vcc lines 41 and the GND lines 42, the hybrid integrated circuit substrates are arranged in a 180-deg rotated manner. In FIG. 2, although four lines are originally required, the device can be realized by using three lines.

When the hybrid integrated circuit substrate 11d is rotated, the connection area 22 of the substrate, and the connection area 25 of the hybrid integrated circuit substrate 11b coincide with each other in the direction of the ordinate. This configuration can be realized by forming the substrates so as to be bilaterally symmetrical with respect to the center line.

According to this configuration, the connection area 25 (or the connection area 24) of the hybrid integrated circuit substrate 11b positionally coincides with the connection area 22 (or the connection area 23) of the hybrid integrated circuit substrate 11d, and can be vertically connected to each other by a short distance via the connecting means 30.

This results in that the connection area 22 (or the connection area 23) of the hybrid integrated circuit substrate 11b positionally coincides with the connection area 25 (or the connection area 24) of the hybrid integrated circuit substrate 11d, and the areas can be vertically connected to each other via the connecting means 30.

Two connection areas are disposed in each of the ends of the wirings 26 and 27. In this example, this configuration is not particularly necessary because the hybrid integrated circuit substrates 11 are arranged in two rows and two columns. When a larger number of hybrid integrated circuit substrates are arranged in the lateral direction, the connecting means 29 for laterally connecting the substrates is connected to the respective hybrid integrated circuit substrates, but some of the substrates fail to be longitudinally connected to each other via the connecting means 30. In FIG. 2, the wirings are fixed to GND via the connecting means 30. When connection in the longitudinal direction also is made by using surplus areas, the wirings can be fixed to a more stable potential.

The rectangles are shown in the wirings 26 and 27 because, when a thin metal wire is used as connecting means, the copper wirings are covered with Ni, and, when leads are used, the wirings are covered with a brazing material. The rectangles show the covering regions. Namely, the covering regions of a brazing material or Ni are indicated by the connecting means.

In order to set the upper side to Vcc and the lower side to GND, the hybrid integrated circuit substrates 11 are arranged so that an odd number of substrates are placed in the column direction. As seen from FIG. 4, when connection between the first wiring 26 and the second wiring 27 in the lower side is to be made, a simple pattern cannot be attained unless columns each consisting of four light emitting diodes LED1 to LED4 are arranged in an odd number. Also in the case where an even number of columns are arranged, the connection to the second wiring 27 in the lower side is enabled. In this case, however, the end exists on the side of the first wiring 26, and hence an excess wiring for connecting the end to the second wiring is required.

When the hybrid integrated circuit substrates 11 of a relatively small size are arranged in parallel or, as required, in a matrix form as described above, the whole irradiation device can be set to have an arbitrary size. Any shape other than a rectangle may be realized by sequentially arranging such hybrid integrated circuit substrates, and connecting the substrates in parallel.

The invention is characterized also in the region indicated by C in FIG. 4. The region is enlargedly shown in FIG. 1. As described above, in the region, the driving circuit and the protection circuit are to be formed.

The reference numeral 50 denotes a transistor, 51 denotes a Zener diode, and 52 denotes a chip resistor. The reference numeral 53 denotes a position recognition mark which is used in the process of die bonding the semiconductor elements 50 and 51. The reference numerals 54 and 55 denote a sealing resin which is applied in order to prevent the semiconductor elements from being deteriorated, 56 denotes a conductive pattern which is formed into an island-like shape, and which functions as a flow stop for the sealing resin 54, 57 denotes a flow stop for the sealing resin 55, and 58 denotes a conductive pattern which is disposed in order to improve the reflection efficiency.

The flow stops function in the following manner. When a resin flows onto a wiring, the wiring is peeled off during the curing process, and, when a resin flows onto a chip resistor or the like, the resistance is varied. Depending on the assembly sequence, the solder fixing properties and the boding properties may be lowered. The flow stops are disposed in order to prevent these problems from arising.

The first feature is that also the mark 53 is covered with a metal of a high reflection efficiency, thereby causing the mark to function also as a reflective plate. The second feature is that lands for stopping a resin flow function also as reflective plates. Therefore, these components are not required to be separately configured, so that the efficiency of the pattern arrangement is improved.

Particularly, each of the sealing resins 54 and 55 before curing is fluid, and hence easily flows. The manner of the flow cannot be predicted, and the flow stops when the sealing resin abuts against the corresponding flow stop. Of course, the sealing resin does not always abut the flow stop to stop the flow. Sometimes, the sealing resin stops short of the flow stop.

In an open region of the region where the circuit C is formed, or the open region surrounded by wirings 60 and the semiconductor elements in this example, reflecting means are disposed. Therefore, the reflection efficiency is further improved.

The positions and number of areas where the circuit C is formed are not restricted. In the case where the formation areas are to be disposed with being scattered over the hybrid integrated circuit substrate, the formation of such a reflective plate in the circuit brings a noticeable effect on the improvement of the reflection efficiency.

Figure 7:
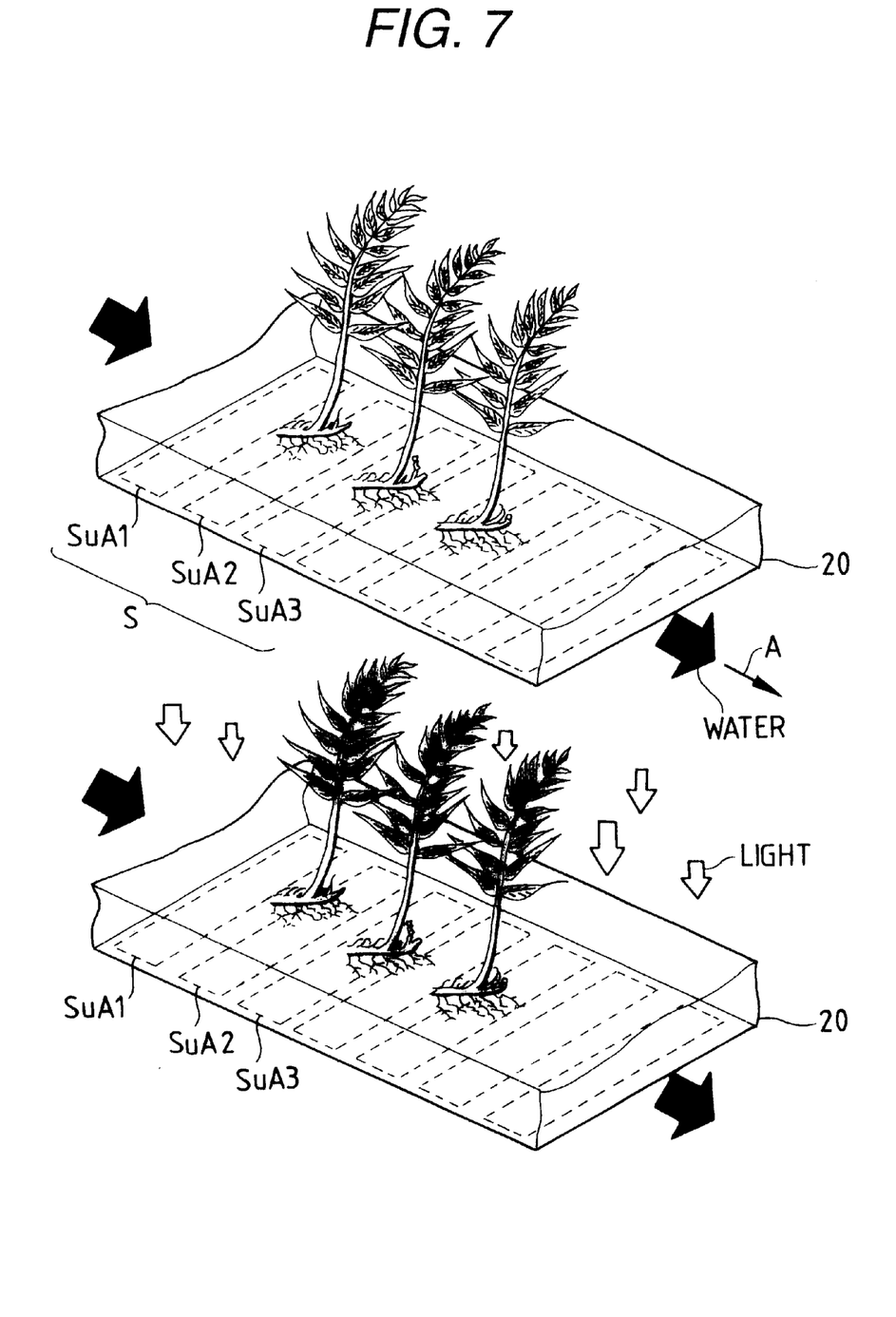
FIG. 7 shows a view illustrating a light irradiating apparatus for growing a vegetable or fruit using a hybrid integrated circuit device of the present invention.

Further as shown in FIG. 7, these hybrid integrated circuit device is used as a light irradiating apparatus for growing a vegetable or fruit such as lettuce or melon, flower and so on. These light irradiating apparatus is constituted by a metallic container 20 filled with water for growing a plant, and a hybrid integrated circuit device S fixed on a rear face of the container 20. The hybrid integrated circuit device S is constituted by arrangement of the hybrid integrated circuit device SuA1,SuA2,SuA3 . . . SuB1,SuB2,SuB3 . . . each of them is as same as shown in FIG. 3.

A light generated by the light emitting diodes is irradiated to the plants P effectively and water in the container 20 is used as a cooling water for absorbing a heat generated by the light emitting diodes and other circuits and suppressing a temperature increase of the light emitting diodes.

According to the apparatus, efficient plant growth can be obtained.

As seen from the above description, the surface of a conductive pattern constituting a protection circuit for a light emitting diode is made of a metal material which is excellent in light reflection, whereby the efficiency of reflection with respect to light emitted from the light emitting diode can be improved.

Furthermore, an island-like conductive pattern is disposed in an open region surrounded by a conductive pattern and/or a semiconductor element, the conductive pattern and/or the semiconductor element constituting the protection circuit, and the surface of the conductive pattern is made of a metal material which is excellent in light reflection, whereby the efficiency of reflection with respect to light emitted from the light emitting diode can be improved.

When the semiconductor element constituting the protection circuit is to be die bonded or wire bonded, a bonder knows the position of a mark and then performs an alignment operation. Also the surface of the mark is made of a metal material which is excellent in light reflection, whereby improvement of the reflection efficiency can be realized.

In order to prevent the semiconductor element from being deteriorated, a resin is applied to the semiconductor element. The applied resin is cured. An uncured resin is fluid and hence may flow even to an unexpected place. In such a case, there arise problems as follows. When a resin flows to a chip resistor and is then cured, the resistance is varied. When a resin flows onto a wiring and is then cured, the wiring is peeled off. A pattern for preventing such a flow from occurring is disposed in an open region. Therefore, the efficiency of reflection with respect to light emitted from the light emitting diode can be improved by configuring the surface of the pattern with a metal material which is excellent in light reflection.

As seen from the above description, when a substrate mainly made of Al is employed, particularly, it is possible to realize a hybrid integrated circuit device which can attain excellent heat radiation properties, light weight, and high workability, and which has a high reflection efficiency.

What is claimed is:

1. A hybrid integrated circuit device comprising:
   a metal substrate covered with an insulation;
   a wiring portion disposed substantially over the metal substrate and substantially covered by a reflective conductive film, comprising electrode regions, said electrode regions isolated from each other by a gap, said reflective conductive film being configured to reflect light;

a mounting region formed on each electrode region; and a light emitting element mounted on each mounting region and connecting one electrode region to another in series.

2. A hybrid integrated circuit device according to claim 1, wherein the gap has a constant width.

3. A hybrid integrated-circuit device according to claim 1, wherein the reflective conductive film covers the wiring portion except for the gap.

4. A hybrid integrated circuit device according to claim 1, wherein the gap has a predetermined width for isolating the electrode regions from each other.

5. A hybrid integrated circuit device according to claim 1, further comprising:

a first wiring region disposed at one end of the substrate; and a second wiring region disposed at the opposite end of the substrate;

wherein the electrode regions connect the first wiring region and the second wiring region in series.

6. A hybrid integrated circuit device according to claim 1, wherein the light emitting elements are arranged in even number column-wise and odd number row-wise.

7. A hybrid integrated circuit device comprising:

a metal substrate covered with an insulation;

electrode regions disposed on the metal substrate said electrode regions being isolated from each other and substantially covering the metal substrate, said electrode regions covered by a reflective conductive film, said reflective conductive film being configured to reflect light;

a plurality of light emitting diodes, each diode coupling one electrode region to another to connect all the electrode regions in series; and a circuit mounted on the metal substrate for driving said light emitting diodes, said circuit covered by a reflective conductive film.

8. A hybrid integrated circuit device comprising:

a substrate;

electrode regions disposed on the substrate, said electrode regions being isolated from each other;

a reflective conductive film covering the electrode regions;

a plurality of light emitting diodes, each diode coupling one electrode region to another to connect all the electrode regions in series; and a circuit mounted on the substrate for driving said light emitting diodes, said circuit covered by a reflective conductive film;

an island-like conductive pattern, comprising a reflective conductive film, disposed in regions on the substrate not occupied by the electrode regions and the circuit;

wherein said electrode regions, the island-like conductive pattern, and the circuit substantially cover the substrate, said island-like conductive pattern is an alignment mark.

9. A hybrid integrated circuit device comprising:

a metal substrate covered with an insulation;

electrode regions disposed on the metal substrate, said electrode regions being isolated from each other;

a reflective conductive film covering the electrode regions;

a plurality of light emitting diodes, each diode coupling one electrode region to another to connect all the electrode regions in series; and a circuit mounted on the metal substrate for driving said light emitting diodes, said circuit covered by a reflective conductive film;

an island-like conductive pattern, comprising a reflective conductive film, disposed in regions on the metal substrate not occupied by the electrode regions and the circuit;

wherein said electrode regions, the island-like conductive pattern, and the circuit substantially cover the metal substrate, said island-like conductive pattern is configured to stop a flow of a resin.

10. A hybrid integrated circuit device comprising:

a metal substrate covered with an insulation;

a first wiring region disposed at one end of the metal substrate;

a second wiring region disposed at the opposite end of the metal substrate;

a plurality of electrodes disposed between said first wiring region and said second wiring region;

a plurality of light emitting diodes, each diode connecting one electrode to another to connect all the electrodes in series; the first wiring region and the second wiring region connected in series through the electrodes;

a circuit mounted on said metal substrate for driving said light emitting diodes; and an island-like conductive pattern disposed in a region on the metal substrate not occupied by the first and second wiring regions, the electrodes, and the circuit;

wherein the first and second wiring regions, the electrodes, the island-like conductive pattern, and the circuit substantially cover the metal substrate and are covered with a light reflective film, said island-like conductive pattern is an alignment mark.

11. A hybrid integrated circuit device according to claim 10, wherein said film comprises any one of Au, Ni, and solder.

12. A hybrid integrated circuit device according to claim 10, wherein a resin is disposed on said circuit and contacts said island-like conductive pattern.

13. A hybrid integrated circuit device according to claim 10, wherein the substrate is made of a surface insulated metal substrate.

14. A hybrid integrated circuit device comprising:

a plurality of the metal substrates of claim 10;

wherein the substrates are electrically connected to each other.

15. A hybrid integrated circuit device according to claim 14, wherein one substrate and another substrate juxtaposed to each other have opposite wiring patterns with respect to each other.

16. A hybrid integrated circuit device according to claim 15, further comprising:

a bonding area or a solder bonding area formed at both ends of each substrate.

17. A hybrid integrated circuit device according to claim 16, wherein the bonding area or solder bonding area has a plurality of areas formed on each of both ends of the substrate.

18. A light irradiating apparatus comprising:
- a plurality of the hybrid integrated circuit devices comprising
  - a metal substrate covered with an insulation;
  - a wiring portion disposed substantially over the metal substrate and substantially covered by a reflective conductive film, comprising electrode regions, said electrode regions isolated from each other by a gap;
  - a mounting region formed on each electrode region; and
  - a light emitting element mounted on each mounting region and connecting one electrode region to another in series;
- a metallic container with the hybrid integrated circuit devices forming a bottom;
  - wherein water for cooling the devices also feeds a plant placed on the devices and a light generated by the devices promotes plant growth.

* * * * *